United States Patent [19]

Patel

[11] Patent Number: 4,525,838

[45] Date of Patent: Jun. 25, 1985

[54] MULTIBYTE ERROR CORRECTING SYSTEM INVOLVING A TWO-LEVEL CODE STRUCTURE

[75] Inventor: Arvind M. Patel, San Jose, Calif.

[73] Assignee: International Business Machines Corporation, Armonk, N.Y.

[21] Appl. No.: 470,846

[22] Filed: Feb. 28, 1983

[51] Int. Cl.$^3$ .............................................. G06F 11/10
[52] U.S. Cl. ......................................... 371/37; 371/38
[58] Field of Search ........................ 371/37, 38, 39, 40

[56] References Cited

U.S. PATENT DOCUMENTS

| | | | |
|---|---|---|---|
| 3,418,630 | 12/1968 | Van Duvren | 371/39 |
| 4,211,997 | 7/1980 | Rudnick et al. | 371/40 |
| 4,334,309 | 1/1982 | Bannon et al. | 371/37 |
| 4,416,010 | 11/1983 | Hibino et al. | 371/37 |
| 4,437,185 | 3/1984 | Sako et al. | 371/37 |

*Primary Examiner*—Jerry Smith
*Assistant Examiner*—Michael R. Fleming
*Attorney, Agent, or Firm*—Richard E. Cummins; Henry E. Otto, Jr.

[57] ABSTRACT

A two-level multibyte error correcting system is disclosed for correcting up to $t_1$ one-byte errors in a codeword in response to processing $2t_1$ non-zero syndrome bytes at the first level and up to $t_2$ one-byte errors in a codeword in response to processing $2t_2$ non-zero syndromes bytes at the second level when processing said $2t_1$ syndrome bytes at said first level does not produce an all zero pattern for said $2t_2$ syndrome bytes. A relatively long block of data may be divided into subblocks, each of which may contain up to $t_1-x$ one-byte errors that are correctable at the first level by processing $2t_1$ non-zero syndrome bytes where one identifiable subblock of the word may contain up to $t_1+x$ one-byte errors which are correctable by processing said $2t_2$ non-zero syndrome bytes where $0 \leq x \leq (t_2-t_1)$.

16 Claims, 9 Drawing Figures

$$T^3 = \begin{bmatrix} 0 & 0 & 0 & 0 & 0 & 1 & 1 & 1 \\ 0 & 0 & 0 & 0 & 0 & 0 & 1 & 1 \\ 0 & 0 & 0 & 0 & 0 & 0 & 0 & 1 \\ 1 & 0 & 0 & 0 & 0 & 1 & 1 & 1 \\ 0 & 1 & 0 & 0 & 0 & 0 & 1 & 1 \\ 0 & 0 & 1 & 0 & 0 & 1 & 1 & 0 \\ 0 & 0 & 0 & 1 & 0 & 0 & 1 & 1 \\ 0 & 0 & 0 & 0 & 1 & 1 & 1 & 0 \end{bmatrix} \begin{matrix} 41 \\ 42 \\ 43 \\ 44 \\ 45 \\ 46 \\ 47 \\ 48 \end{matrix}$$

COL. 0 1 2 3 4 5 6 7

MULTIBYTE ERROR CORRECTING SYSTEM INVOLVING A TWO-LEVEL CODE STRUCTURE

BACKGROUND OF THE INVENTION

1. Field of Invention

This invention relates in general to a system and method for correcting multiple byte errors in a codeword and, in particular, to a method and system for correcting multibyte errors in a relatively long block of data read from a disk file.

2. Description of the Prior Art

The prior art discloses various systems and methods for correcting errors. The following references disclosed many of the basic ECC theories and systems.

1. I. S. Reed and G. Solomon, "Polynomial Codes Over Certain Finite Fields", J. Soc. Indust. Appl. Math. 8, pp. 300–304, 1960.
2. W. W. Peterson and E. S. Weldon, *Error-Correcting Codes*, M.I.T. Press, 1972.
3. D. C. Bossen, "b-Adjacent Error Correction", IBM J. Res. Devel. 14, pp. 402–408, 1970.
4. A. M. Patel and S. J. Hong, "Optimal Rectangular Code for High-Density Magnetic Tapes", IBM J. Res. Devel. 18, pp. 579–588, 1974.
5. A. M. Patel, "Error-recovery Scheme for the IBM 3850 Mass Storage System", IBM J. Res. Devel. 24, pp. 32–42, 1980.
6. G. D. Forney, *Concatenated Codes*, M.I.T. Press, 1966.
7. P. Elias, "Error-free Coding", IEEE Trans. Inf. Theory, Vol. IT4, pp. 29–37, 1954.
8. R. C. Bose and D. K. Ray-Chaudhuri, "On a Class of Error-correcting Binary Group Codes", Inf. Control 3, pp. 68–79, 1960.
9. J. K. Wolf, "Adding Two Information Symbols to Certain Non-binary BCH Codes, and Some Applications", Bell Systems Tech. J. 48, pp. 2408–2424, 1969.
10. R. T. Chien, "Cyclic Decoding Procedures for Bose-Chaudhuri-Hocquenghem Codes", IEEE Trans. Inf. Theory, Vol. IT10, pp. 357–363, 1964.
11. E. R. Berkkamp, *Algebraic Coding Theory*, McGraw Hill, 1968.

It has long been recognized by the art that the data stored on a magnetic medium, such as a disk file, will be subject to errors during the read back process for a number of valid technical reasons. Present day disk files include a number of different approaches to minimizing the number of errors that may occur during the read back process. For example, most disks undergo a thorough surface analysis test to identify defective areas before the disk is incorporated into the drive. Those disks having errors above a certain predetermined criteria are rejected, which does have an adverse affect on the manufacturing cost of the disk drive.

In addition, systems are provided in many disk drives which, based on defect data stored on a disk, cause the drive to avoid a bad track, a bad sector, or a defective area of a disk track. These later systems involve skipping bad areas during the storage of data on the track. Other systems are included in the file which operate to reread the data when an error is detected. The rereading operation occurs under slightly different conditions each time, such as offsetting the transducer from the center of the track or increasing the gain of the read amplifier until, hopefully, the error is corrected during the rereading process.

The addition of such error recovery systems is motivated primarily by the realization that it is important to minimize the number of errors that have to be corrected by associated error correcting circuitry since use of the ECC system may adversely impact overall system performance. In addition, usable storage capacity is decreased since considerably more redundancy is required if more errors must be corrected.

Systems which correct only single errors are used exclusively in current disk files. A single error, by definition, may include a burst type error involving a group of contingent bit positions. However, two separate burst errors or even widely spaced single bit errors cannot be corrected by these single error correcting systems. Consideration must, therefore, be given to the length of the data block that will correspond to the codeword in order to minimize or prevent the occurrence of more than one error in that data block. That consideration is generally based on statistical data in terms of the number of errors that can be expected on a probability basis.

While prior art systems and methods for correcting single errors operate successfully, it is recognized that their use does impact system performance so that considerable effort and expense are taken in the design of disk files to minimize their use, as explained above.

The art has further recognized that all the different error patterns which occur in one byte of a multibyte codeword are correctable using a reasonable amount of redundancy. It has also been recognized that by interleaving codewords, a burst which extends longer than one byte may be corrected, provided the length of the burst is less than "m" bytes.

It is also known that a multibyte, i.e., more than one, error correcting system may be provided in accordance with the teaching of applicant's copending application Ser. No. 454,393, filed Dec. 29, 1982, entitled "On-the Fly Multibyte Error Correcting System", and assigned to the assignee of the present invention.

One of the main reasons why multibyte error correcting systems have not been readily adopted for disk files is the constraint imposed by those codes on the block size or codeword. It is recognized that the codeword is limited to $2^b$ where b is the number of bit positions in the byte employed in the system. Where the byte consists of eight bits, which is substantially a standard in the data processing industry, the codeword there cannot exceed generally 255 bytes. It is further recognized that for each error to be corrected in that codeword of 255 bytes, two check bytes must be associated with the codeword for each error. For example, if the code is designed to correct five errors in each codeword, then ten check byte positions must be provided out of the 255 byte positions.

It can be seen that in such arrangements the redundancy becomes quite high and the overall capacity of the disk file is severely restricted.

Besides adversely affecting useful storage capacity, the relatively small block size also imposes many undesirable constraints in the design of the data format that is used on the track.

In future disk files, it is desirable to provide better reliability and availability in spite of higher data storage density and data rates.

Conventional coding techniques, such as multiple error correcting Reed-Solomon or BCH codes discussed in references 1–3, while very efficient in terms of mathematical redundancy, impose algebraic constraints on the size of the codeword for a given choice of byte size. Thus, in a practical application of 8-bit bytes and with high error rates, the redundancy is often still unacceptable. These considerations present major hurdles in the application of these conventional coding techniques to future disk files.

A system for correcting multiple errors which does not present these major hurdles is desired. The present invention provides such a system.

SUMMARY OF THE INVENTION

In accordance with the present invention, a multibyte error correcting system is provided which employs a two-level code structure consisting of subblocks within a block. The structure provides two major advantages. First, the improved method and system eliminates the problem of the constraint on the size of the codeword and, second, a decoding strategy is established that permits "on-the-fly" correction of multibyte errors at the subblock level and additional reserve error correction capability at the block level.

The two-level coding structure of the present invention employs a data format on a disk track involving subblocks within a block. As described, each subblock includes two or more interleaved primary codewords. At the first code level, the coding structure is designed to correct $t_1$ symbols or errors per primary code word so that each subblock includes $2 \times t_1$ check bytes, i.e., two check bytes for each error in the primary codeword. The system is arranged to correct $t_1$ errors in each primary codeword in the "on-the-fly" manner suggested by the above-mentioned application Ser. No. 454,393. The code structure is extended to $t_2$ symbol correction at the block level by providing additional block level check bytes which, on reading stored data, reflect corrections inserted at the first level. The block level syndromes developed at the second level, therefore, provide an indication (an all zero syndrome) of whether the corrections to the primary word at the subblock level were valid or whether a miscorrection had been applied (a pattern of not all zeros). The miscorrection occurs because the primary word had more than $t_1$ errors, e.g., $t_1 + x$ errors. The system corrects these $t_1 + x$ errors in the primary word by using the block syndromes after a modification to reflect the miscorrection, and the syndromes developed from the $2 \times t_1$ check bytes associated with the primary word. The block syndrome bytes and the syndromes of the primary word are sufficient to correct up to $t_2$ errors ($t_2 \geq t_1 + x$) in one of the subblocks.

Since the $t_2$ symbol error's capability is shared over several subblocks and is required for only one subblock in a block, any processing at the block level may also be completed for the block in an on-the-fly manner.

It is, therefore, an object of the present invention to provide an improved multibyte error correcting system and method for use in a disk file.

A further object of the present invention is to provide an ECC system for correcting multiple errors in a relatively long block of data stored on a disk file in a manner which minimizes impact on system performance.

Another object of the present invention is to provide an ECC system for correcting multiple errors in a relatively long block of data stored on a disk file in which there is little or no constraint on the manner in which the data is formatted on the track.

The foregoing and other objects, features and advantages of the invention will be apparent from the following more particular description of a preferred embodiment of the invention as illustrated in the accompanying drawing.

BRIEF DESCRIPTION OF THE DRAWING

FIG. 4a is an illustration of the logic of the matrix multiplier illustrated in block form in FIGS. 3 and 6, while FIG. 4b is the matrix $T^3$ which determines the logic operations of FIG. 4a;

DESCRIPTION OF THE PREFERRED EMBODIMENT

Figure 1:
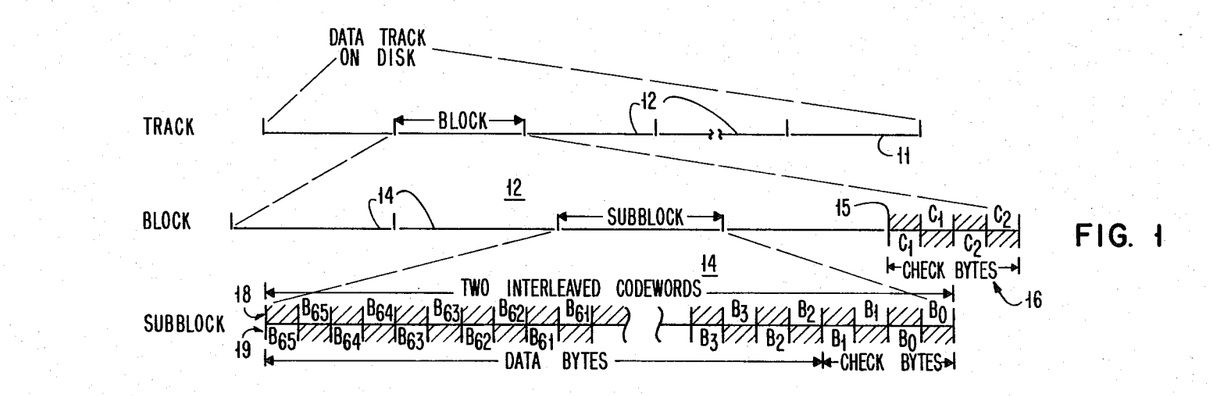
FIG. 1 is a diagrammatic illustration showing the data format of the two-level coding structure for a disk track.

FIG. 1 illustrates the data format of a disk track that embodies the two-level code structure of the present invention. It is assumed for purposes of describing a specific embodiment of the present invention that the multibyte ECC system, as shown and described, is designed to correct up to two errors in each block, an error being defined as any pattern of eight bits in one byte position of the block other than the correct pattern. It should be understood however that the invention is applicable to systems for correcting any number of errors in the block, and later on in the specification, a mathematical proof establishing the general case is provided.

As shown in FIG. 1, a track 11 is formatted into a plurality of equal length blocks 12, each of which are divided into a predetermined plurality of subblocks 14. A block check byte area 15 is associated with each block which, as shown, includes four check byte positions 16. Each subblock 14, as shown, comprises two interleaved codewords 18 and 19 which are of equal length. Two pairs of check byte positions $B_1$ and $B_0$ are associated with each subblock so that a different pair of check byte positions $B_1$ and $B_0$ are associated with each subblock codeword 18 or 19.

The details of the two-level code will be discussed in connection with the following main design parameters where:

b = number of bits in a byte (symbol)
m = number of data bytes in a primary word
n = number of subblocks in a block
g = amount of interleaving (number of interleaved words)
$t_1$ = number of errors corrected at the subblock level
$t_2$ = number of errors corrected at the block level The parameters b, m, n and g determine many of the important capabilities of the code. For example, one symbol correction at the subblock level with "g" interleaved words protects against a burst error signal of a length up to (bg−b+1). Two-symbol correction at the block level with "g" interleaved words at the subblock level protects against two different burst errors, each of which may be (bg−b+1) bits in length or one long burst up to (2bg−b+1) bits.

The above identified parameters of the ECC code allow the capabilities of the code to be adjusted to match the actual measured error conditions of a product without a change in the ECC system hardware even though the actual conditions, as measured, are substantially different from those conditions for which the system was initially designed.

The word length parameter m in bytes and the number n of subblocks in a block determine the capability of the code. The word length must satisfy the following equation:

$$m+2 \leq (2^b - 1)$$

where b represents the number of bit positions in a byte of the word.

The block length n in bytes is equal to the number g of interleaved words times the number of bytes in each word times the number of subblocks in the block.

In the system shown in FIG. 1, it is assumed a word comprises 64 data byte positions (m) and two check byte positions $B_1$ and $B_0$ and a subblock has two (g) interleaved words. A block, therefore, comprises four subblocks of 128 byte positions or 512 byte positions and two pairs 15 and 16 of block check bytes $C_1$ and $C_2$, one pair being associated with even columns and the other pair being associated with odd columns.

In general, while the two-level multibyte ECC system operates at the block level, the following description is directed to processing only one of the interleaved codewords since both are processed in the same manner. The operation involves first processing the two syndrome bytes corresponding to the two check bytes associated with one word of the interleaved words of the subblock. In the specific embodiment disclosed, an error in any one byte of the word will first be corrected, regardless of the number of bit positions in a byte that are in error. Thus, any of the possible 255 error patterns in an 8-bit byte of the word will be correctable by suitably processing the two syndrome bytes provided there are no other errors in that word.

The block syndromes corresponding to one of the two pairs 15 and 16 of check bytes $C_1$ and $C_2$ associated with the block are only processed when the corresponding codeword in a subblock is identified as containing more than one byte in error. Since the multibyte (2) error correction capability is shared over several relatively small subblocks and is required for only one subblock (or none) in a block, the error processing may be easily completed on-the-fly at the block level. The relationship of the block and subblock provide a unique structural advantage in the coding equations for the code of the present invention which are not available or suggested by other prior art two-level coding schemes such as concatenated codes or product codes of References (6) and (7).

The preferred embodiment of the present invention as illustrated in the drawing is based on codes for symbols in Galois Fields ($2^8$) or GF($2^8$). The primary codeword consists of two check bytes designated $B_0$ and $B_1$, and m data bytes designated $B_2, B_3, \ldots B_{m+1}$, which satisfy the following modulo 2 matrix equations:

$$B_0 \oplus TB_1 \oplus T^2B_2 \oplus \ldots \oplus T^{m+1}B_{m+1} = 0 \quad (8)$$

$$B_0 \oplus T^2B_1 \oplus T^4B_2 \oplus \ldots \oplus T^{2(m+1)}B_{m+1} = 0 \quad (9)$$

In Equations 8 and 9 the $\oplus$ represents a modulo 2 summation operation, $B_i$ is an 8-bit column vector, i is a vector position in the codeword and has a value from 0 to m+1, where m+1 is equal to or less than 254 or ($2^8 - 2$). T is a companion matrix of a primitive polynominal of degree 8. The symbol $T^i$ represents T multiplied by itself i times. It is assumed that the following T matrix is embodied in the preferred embodiment:

$$T = \begin{pmatrix} 0 & 0 & 0 & 0 & 0 & 0 & 0 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 1 \\ 0 & 0 & 0 & 1 & 0 & 0 & 0 & 0 \\ 0 & 0 & 0 & 0 & 1 & 0 & 0 & 1 \\ 0 & 0 & 0 & 0 & 0 & 1 & 0 & 0 \\ 0 & 0 & 0 & 0 & 0 & 0 & 1 & 1 \end{pmatrix} \quad (10)$$

Equations 8 and 9 per se correspond to prior art single-symbol-correcting Reed-Solomon or BCH codes in which the 8-bit column vectors correspond to elements of GF($2^8$). In the notation of Equations 8 and 9, the multiplication by matrix $T^i$ corresponds to the multiplication by the Galois field element $\alpha^i$ where $\alpha$ is a primitive element represented by the first column of the matrix T.

Figure 2:
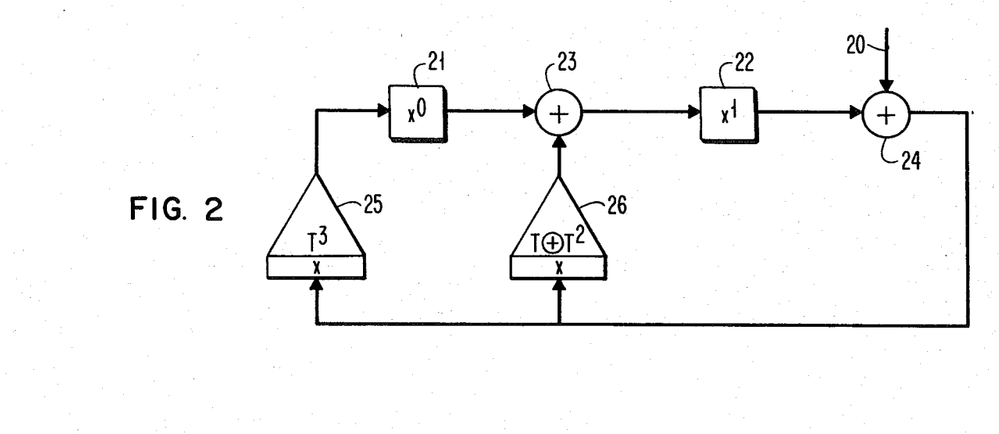
FIG. 2 is a schematic representation of the feedback shift register employed in the subblock check byte encoding operation for the error correcting system embodying the present invention.
Figure 3:
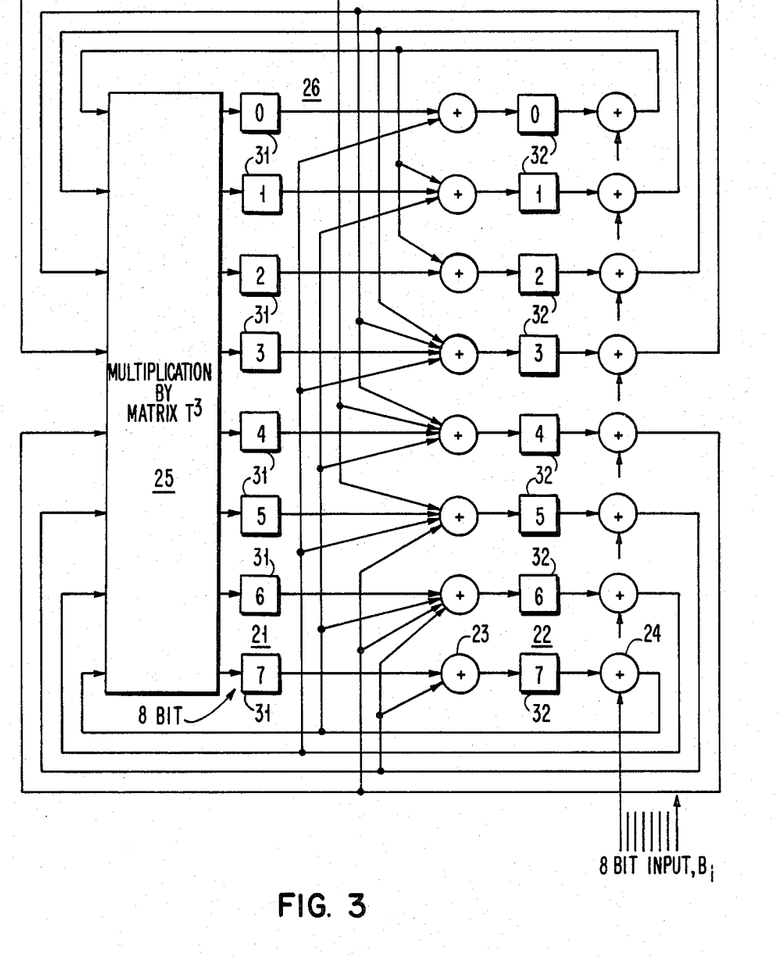
FIG. 3 is a block diagram of the specific logic for the feedback shift registers shown schematically in FIG. 2.

FIG. 2 is a schematic diagram of the encoder for generating the check bytes $B_0$ and $B_1$ for each word in a subblock, while FIG. 3 illustrates the encoder in FIG. 2 in more conventional functional logic blocks. The encoder functions to perform modulo g (x) operations where g (x) is a polynomial with roots $\alpha$ and $\alpha^2$. The specific generator polynomial is $$g(x) = T^3 x^0 \oplus (T + T^2) x^1 \oplus x^2$$

The check bytes $B_0$ and $B_1$ for one word are developed by supplying the date bytes $B_{m-1}$ through $B_2$ to input 20 of FIG. 2. In FIG. 2, block 21 and block 22 function to store an 8-bit field element. Blocks 23 and 24 function to add two 8-bit field elements modulo 2 while blocks 25 and 26 function as matrix multipliers to multiply an 8-bit field element by a specific matrix. Initially, blocks 21 and 22 are set to zero and the data bytes are clocked into the encoder at input 20. At the end of the operation, the encoder contains check bytes $B_1$ and $B_0$ in its 8-bit blocks 22 and 21, respectively.

Figure 4A:
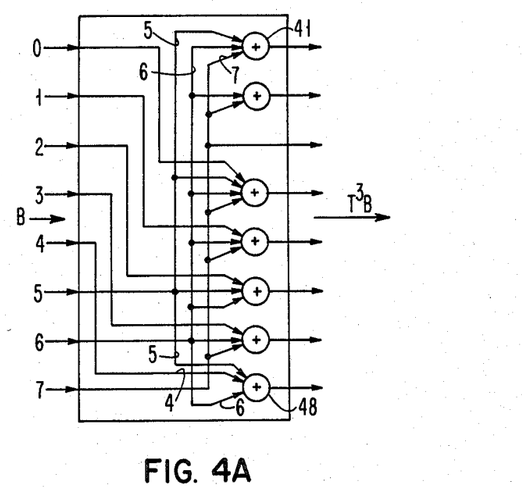
Figure 4B:
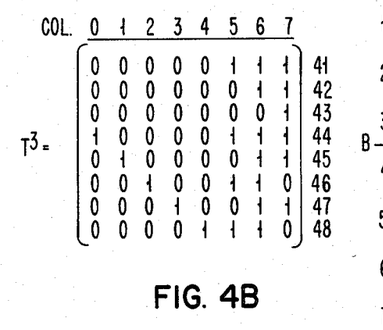

The details of the matrix multiplier for $T^3$ represented by block 25 in FIGS. 2 and 3 are shown in FIG. 4a in which B represents an 8-bit input vector, selected bit positions of which are combined modulo 2 in blocks 41 through 48. The bit positions selected for inputs to blocks 41 and 48 are determined from matrix $T^3$. As shown in FIG. 4b, the top row determines the input for block 41, while the bottom row determines the input for blocks 48, a binary 1 digit in a column signifying an input from the corresponding bit position of the input vector B. Hence, block 41 receives input from bit positions 5, 6 and 7, while block 48 receives input from bit positions 4, 5 and 6 corresponding respectively to the columns containing ones in the matrix $T^3$. The inputs to other blocks are arranged in a similar manner.

The encoder for developing check bytes $C_1$ and $C_2$ which are two of the four check bytes associated with the second level of coding is similar to the encoders for $B_0$ and $B_1$ in that $C_1$ and $C_2$ are first developed for each subblock and accumulated modulo 2 over all subblocks, as specified by the following modulo 2 matrix equations:

$$C_1 = \sum_{subbk=1}^{n} \left( \sum_{i=0}^{m+1} B_i \right)_{subbk} \quad (11)$$

$$C_2 = \sum_{subbk=1}^{n} \left( \sum_{i=0}^{m+1} T^{3i} B_i \right)_{subbk} \quad (12)$$

Figure 5:
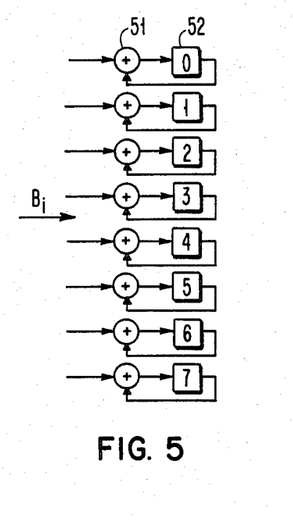
FIG. 5 is a block diagram of the specific logic employed in the ECC system for generating one block check byte.
Figure 6:
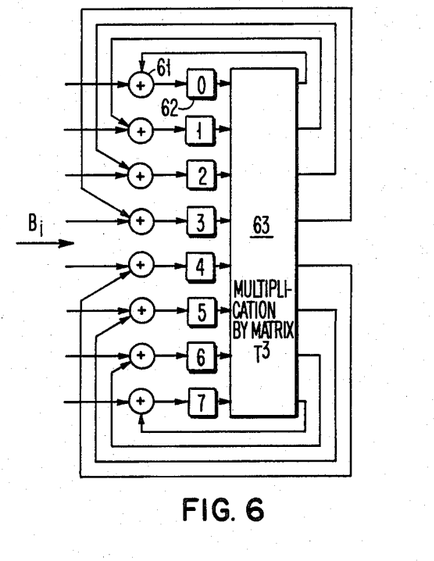
FIG. 6 is a block diagram of the logic employed for generating the second block check byte.

Unlike the encoder for $B_0$ and $B_1$, a separate shift register encoder, as schematically shown in FIGS. 5 and 6, is employed to develop check bytes $C_1$ and $C_2$. The encoder for $C_1$, as shown in FIG. 5, is equivalent functionally to a parity generator for each bit position of the input vectors. As shown in FIG. 5, block 51 represents an exclusive-OR circuit, while block 52 represents one stage of a register. Blocks 61 and 62 in FIG. 6 represent similar binary logic elements, while block 63 is a matrix multiplier of the type shown in FIG. 4 and described earlier in the specification.

Initially, each separate register 52, 62 for $C_1$ and $C_2$ is set to zero, and bytes $B_i$ of the first subblock are supplied to each encoder starting with $B_{m+1}$ through $B_0$ in (m+2) successive shifts. At the end of the shift sequence, the contents of register 52 of FIG. 5 corresponds to $C_1$ for the first subblock, and the contents of register 62 of FIG. 6 corresponds to $C_2$. $C_1$ and $C_2$ for each successive subblock of the block are accumulated modulo 2 over the four subblocks in a suitable buffer.

It will be recognized that if there is only one subblock, the four check bytes $B_0$, $B_1$, $C_1$ and $C_2$ corresponding to Equations 8, 9, 11 and 12 together may be considered to represent a code that is obtained in Reference (9) by extending a two-symbol correcting BCH code such as that described by J. K. Wolf in an article in the Bell System Technical Journal, No. 48, pages 2408 through 2424, published in 1969 and entitled "Adding Two Information Symbols to Certain Nonbinary BCH Codes and Some Applications".

In the present embodiment, the block level codeword can be viewed as a modulo 2 super-position of the four subblock codewords so that a two-symbol error in this super-positioned codeword is correctable in accordance with the following described logic.

Assume that a block consisting of four subblocks encounters two one-byte errors. If each one of the errors is in a different subblock, then these errors will be corrected by the single-error-correcting first-level portion of the ECC system by processing the syndrome bytes corresponding to the $B_1$ and $B_0$ check bytes associated with the word in each subblock having one error. After the appropriate corrections have taken place, the syndrome bytes corresponding to $C_1$ and $C_2$ will indicate no error in the block, i.e., all zeros in these syndromes. However, assume that the two one-byte errors are in one subblock. The first-level system then either miscorrects the errors or indicates an uncorrectable error condition to the system which may be interpreted at that point as having more than one byte in error. If there has been a miscorrection, then the syndromes corresponding to $C_1$ and $C_2$ will not be all zeros. Next, the miscorrection is removed from the word based on the fact that the syndromes corresponding to $C_1$ and $C_2$ indicate that a miscorrection has occurred (or that there are more than one error.) Once the miscorrection has been removed, the two syndrome bytes corresponding to $B_0$ and $B_1$ for that word, and the modified syndrome bytes corresponding to $C_1$ and $C_2$ for that particular block are employed to correct the two bytes in error in the identified subblock in accordance with any of the known prior art arrangements for correcting multiple errors in one block employing the designated syndromes.

The portion of the system which functions to correct the multibyte error in one subblock by processing the four syndrome bytes $S_0$ through $S_3$ corresponding to check bytes $B_0$, $B_1$, $C_1$ and $C_2$ may be identical to the "on-the-fly" system described in the applicant's copending application Ser. No. 454,393 identified in detail earlier in the specification. The specific details of the logic or the detailed steps involved in correcting the two-byte error in the subblock by processing the four syndrome bytes form no part of the present invention. An understanding of one embodiment for performing that function may be obtained from reviewing that application. Other prior art arrangements for correcting two errors in a word by processing four related syndrome bytes may, of course, be employed.

Figure 7:
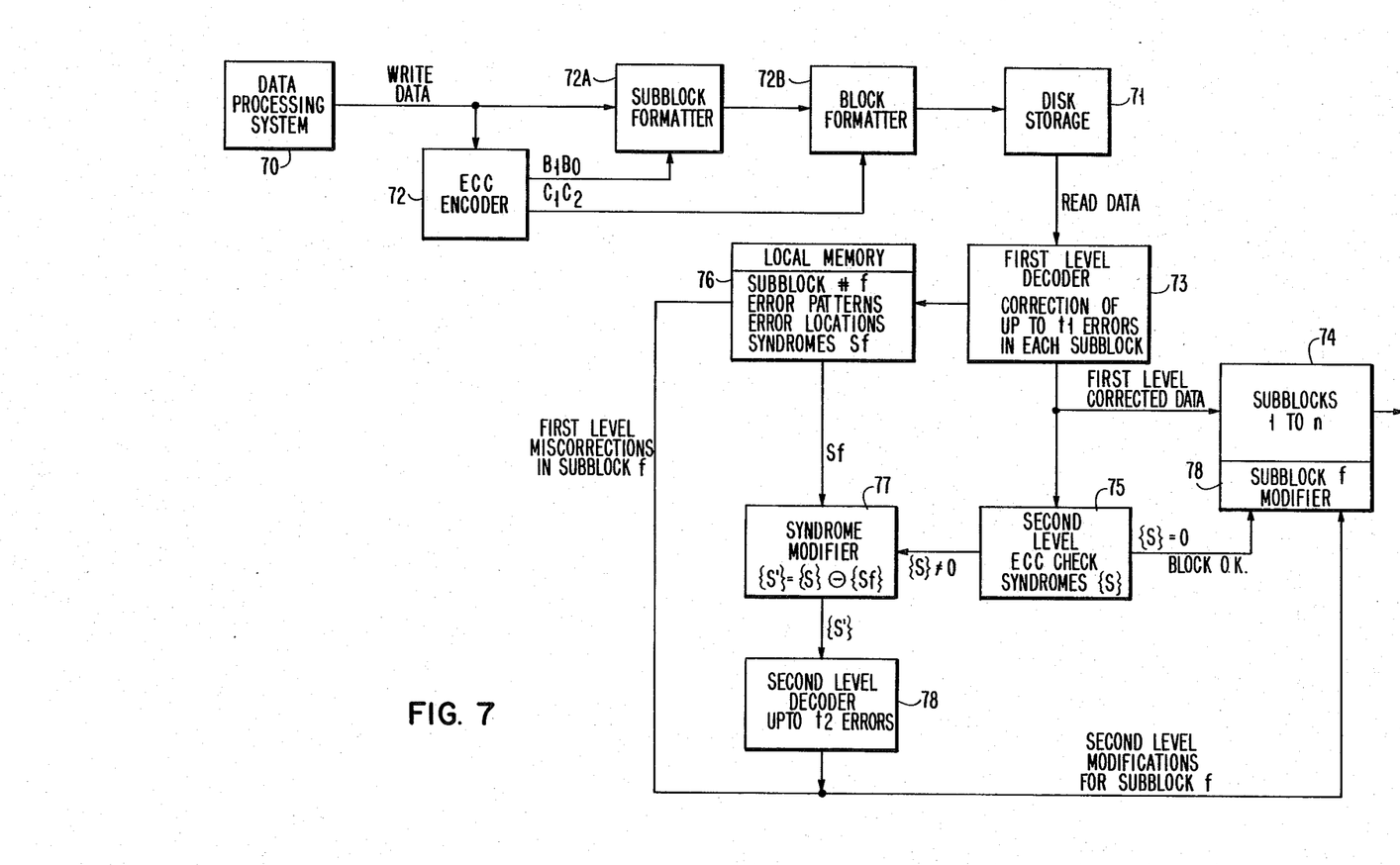
FIG. 7 is a block diagram of the first and second level portions of the ECC system correcting single errors in the subblocks by processing subblock syndromes and for correcting two errors in a subblock by processing subblock and block syndromes.

The present invention provides subblock and block syndrome bytes and an indication of the subblock containing the multiple one-byte errors. FIG. 7, which is an overall block diagram of the present invention, shows the interrelationship of the syndrome processing block for multibyte errors with the rest of the system, as shown.

As shown in FIG. 7, data from the data processing system 70 is sent to disk file 71 for storage on a track which is formatted as shown in FIG. 1. In the transfer of this data, two sets of check bytes $B_1$ and $B_0$ are developed for each subblock by the ECC encoder 72 in accordance with the previous description. Similarly, two pairs of block check bytes $C_1$ and $C_2$ are also developed by the encoder 72. The subblock formatter 72A appends the check bytes $B_1$ and $B_0$ to each corresponding subblock. Similarly, the block formatter 72B appends the block check bytes $C_1$ and $C_2$ at the end of the block. The formatted data is then recorded on the disk storage 71. In the embodiment shown, one set of the block check bytes is developed by merely accumulating the subblock check bytes $B_1$ and $B_0$ which need not be recorded at the block level. These block check bytes are associated with syndromes $S_1$ and $S_2$, while the $C_1$ and $C_2$ check bytes are associated with the $S_0$ and $S_3$ syndrome bytes and are developed during the read process by the logic circuitry previously described. It should be understood that the subscript numbers assigned to the syndromes, that is, $S_0$, $S_1$, etc., are related to the particular T matrix employed to generate the respective check characters. Specifically, $S_0$, which is developed from $C_1$, corresponds to a conventional parity check byte since each bit position of the word is checked, as shown in FIG. 4. $S_3$, on the other hand, is developed from $C_2$ which is generated in accordance with the logic shown in FIG. 5 that involves multiplying the input byte by a matrix $T^3$. Check bytes $B_1$ and $B_0$, which are used to develop $S_1$ and $S_2$ are generated in accordance with the logic of FIGS. 1, 2 and 3 which involves matrices $T^1$ and $T^2$.

It can be shown that the four block syndrome bytes required to correct two one-byte errors in one subblock may be obtained from check bytes which are independent of the subblock check bytes $B_1$ and $B_0$. The four matrices $T^a$, $T^{a+1}$, $T^{a+2}$, $T^{a+3}$ which are selected for generating the four block check bytes, however, must be adjacent powers $a$, $a+1$, $a+2$, and $a+3$ of the matrix T in the $GF(2^8)$ field. The preferred embodiment saves redundancy and hardware in making use of the accumulated subblock check bytes $B_1$ and $B_0$ for each word of the block.

Referring again to FIG. 7, the block 73 represents the first level ECC function of correcting a byte error in each of the two interleaved words. A block of data is read from the file and stored in the block buffer 74 by subblocks. If syndromes $S_1$ and $S_2$ for each word of the subblock are all zeros, then no error has occurred. If all four subblocks are error-free, then block 75, which generates $S_0$ and $S_3$, will also indicate an error-free block and the block may be sent to the data processing system 70.

Where only one one-byte error has occurred in a word, that error is corrected by the first level ECC block 73 so that block 75 again confirms an error-free block since the four syndrome bytes reflect corrected words and will, therefore, be all zeros.

The third situation that may occur in the system shown in FIG. 7 is where the first level ECC block 73 miscorrects a byte of data in a subblock, say f, in response to processing the non-zero $S_1$ and $S_2$ syndrome bytes. It will be assumed that the miscorrection occurred because the word contained two errors and not that an uncorrectable error greater than two had occurred, although block 73 will provide an uncorrectable error signal when some two-error situations occur. It is further assumed that since the double-error has occurred in one subblock, the other subblocks are error-free. Under the assumed conditions, the fact that the word has been miscorrected will be detected by the non-zero condition of either or both the $S_0$ and $S_3$ block syndrome bytes. When this occurs, the system returns subblock f to its original condition. Since the error pattern is stored in the buffer 76 along with subblock data, subblock f is read out with the error pattern through the correction logic 78, modified, and returned to the buffer. Also, the original four syndrome bytes are modified by block 77 to reflect the original two-error condition. The modified set $\{S'\}$ of syndrome bytes are then processed by block 78 to decode both errors in subblock f which are also sent to the correction logic 78 during the modification of subblock f. The block of data is then transferred to the data processing system 70 with no errors.

The last error condition that may occur in the system is where one subblock contains more than two errors and, hence, is uncorrectable. This error condition is beyond the capability of the code, hence, it may get miscorrected. Sometimes this will be indicated by the second level decoder 78 when, as a result of processing a modified set $\{S'\}$ of syndrome bytes, an uncorrectable error signal is provided since the syndrome processing circuitry of block 78 was unable to identify the location and/or error pattern of one or both errors.

Figure 8:
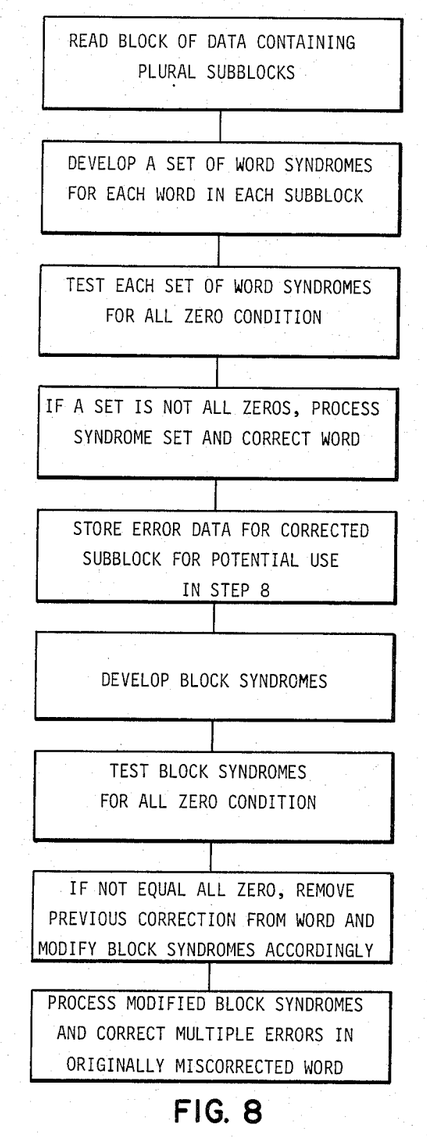
FIG. 8 is a block diagram showing the general decoding process.

FIG. 8 is a flow chart which summarizes the operations just described as sets forth the sequence of steps involved in the method of the present invention.

While the preferred embodiment, as shown and described, assumed the two-level code structure in which a one-byte error in a codeword was correctable at the first level and a two-byte error was correctable at the block level, it should be understood that the method and system may be modified to handle $t_1$ errors at the first codeword level and $t_2$ errors at the block level where $t_1$ is greater than one and $t_2 > t_1$.

It should be recognized in connection with the system just described that in order for the correcting process to work at the second level to correct two errors in the subblock, it is necessary to identify which subblock contained two one-byte errors. In the system described, a subblock is identified by the non-zero subblock syndromes which, when processed by the first level syndrome processing circuits, indicates either an uncorrectable error or provides a one-byte "correction" which, in effect, is a miscorrection that is subsequently detected by the non-zero condition of the block syndromes. If any other subblock provides non-zero syndromes, which causes the first level syndrome processing circuits to perform a correction, it is then not possible to correct the block since the number of errors in the block and their distribution necessarily exceeds the correcting capacity of the system. Thus, in the illustrated embodiment, where the block comprises four subblocks, each with two interleaved codewords, the system could correct up to eight one-byte errors, provided that each error was in a different codeword. However, if one or more codewords in one subblock contain two one-byte errors, then, for the system to correct these errors, all codewords in other subblocks in the block must be error-free. In general, $t_1$ is the number of errors correctable at the subblock level and $t_2$ is the number of errors correctable at the block level. It is shown later in the specification that the combined capabilities of the two-level code architecture can provide correction of various combinations of multi-symbol errors distributed over many subblocks. This is stated in the following theorem. The combined capability of the two-level system provides correction of any combination of $(t_1+x)$ errors in any one subblock, any combination of up to $(t_1-x)$ errors in each of the other subblocks, and y errors in the block level check bytes. In this theorem, x and y are unspecified integers such that $(0 \leq x \leq x+y \leq t_2-t_1)$. The subblock level code has a minimum Hamming distance $d_1 \geq (2t_1+1)$, while the block level code has a minimum distance $d_2 \geq (2t_2+1)$.

The general decoding process set forth in FIG. 8 is followed except that an identification of the subblock containing an error is stored, along with the number of errors and error patterns for up to the maximum number of errors $t_1$ whenever a subblock error is detected. The key step in the decoding process is the ability to identify the subblock in the word which should be processed by the second level syndrome processing circuits using the block syndrome bytes in cases where more than one subblock contains an error that was corrected. The following proof establishes that the subblock having the highest number of bytes corrected at the first level is the subblock which should be corrected using the block syndromes. For example, assume the first level can correct up to two errors for each codeword, and the block can correct up to four errors. If three errors occur in one subblock A and one error in subblock D, then the first level system in processing syndromes for subblock A would indicate either an uncorrectable error or proceed to modify two bytes in that subword in what appears as a normal correction but, in effect, is a miscorrection which adds two additional errors to the subblock. In processing subblock D, one error would be indicated and that one error would be corrected during syndrome processing by the first level circuits. The block syndromes, however, would indicate the possibility of a miscorrection in that a non-zero condition would be indicated. Since two subblocks were corrected, either subblock might be the one containing more errors than the first level system could handle. The theorem establishes that the subblock which is to be corrected at the block level is the subblock which received the most number of bytes corrected at the first level which, in the example, was block A. The original three errors in block A will then be corrected by the process of FIG. 8. The proof of this theorem follows.

Assume that one subblock (i=f) contains (t+x) errors, each of the other subblocks (i≠f) contains up to $(t_1-x)$ errors. The integers x, y and f are not known and $0 \leq x \leq x+y \leq (t_2-t_1)$.

When x=0, all errors at the subblock level are corrected properly since they are all within the capability of the subblock code.

When x>0, consider the subblock f with $(t_1+x)$ errors. Since the minimum Hamming distance $d_1$ is $(2t_1+1)$, the nearest codeword must differ from the received word in at least $(2t_1+1)-(t_1+x)$ positions. Thus, the decoder may miscorrect the subblock f by introducing additional errors in at least $(t_1-x+1)$ positions and as many as $t_1$ positions to go to the nearest codeword. Or the decoder may find subblock f uncorrectable if its Hamming distance from the nearest codeword is greater than $t_1$. In contrast, the decoder will correct $(t_1-x)$ or fewer positions in each of the other subblocks, all of which will be corrected properly.

At the block level, the syndrome set {S} is computed from received data which include all subblock level error corrections. The set {S} is, then, the block level syndrome set for all errors still present in the block, that is in subblock f and the block level check bytes. These are, at the most, $(t_2+t_1)$ errors which include $(t_1+x)+y$ original errors and up to $t_1$ miscorrections. Since the minimum Hamming distance $d_2 \geq (2t_2+1)$ exceeds $(t_2+t_1)$, the corresponding syndromes {S} must be non-zero. Thus, the uncorrected or miscorrected errors in the block will be detected at the block level of the decoding procedure.

The subblock f, with $(t_1+x)$ errors is uniquely identified during processing subblock syndromes from the fact that it was declared uncorrectable or the number of corrections in subblock f exceeds those in any of the other subblocks by at least 1. If all subblocks were corrected properly at the subblock level, then the value of f is of no consequence at the block level.

Let $\{S_f\}$ denote the block level syndromes due to the error patterns introduced by the decoder in subblock f. We can remove these error patterns from subblock f and their contributions $\{S_f\}$ from the syndromes {S}. Thus, the set $\{S\} \ominus \{S_f\}$ represents the syndromes for the original $(t_1+x)$ errors in subblock f and y errors in the block level check bytes. The subtraction $\ominus$ is the same as the addition $\oplus$ in modulo 2 arithmetic which is accomplished by the conventional bit-by-bit exclusive-OR logic function.

The syndromes {S} and $\{S_f\}$ are all known quantities. The block level decoding of $\{S\} \oplus \{S_f\}$ for $t_2$ errors provides proper correction of all remaining errors. This completes the proof.

Note that one burst error covers any error of length up to 9 bits. Two consecutive burst errors cover any error of length up to 25 bits. Three consecutive burst errors cover any error of length up to 41 bits.

It should also be noted that while the disclosed embodiment illustrates a block of data comprising four subblocks, the general case proof shows that a block may contain only one subblock which may be one codeword having $2t_1$ check bytes which permits correcting $t_1$ errors at the first level and $2t_2$ check bytes which permits correcting up to $t_2$ errors at the second level. The second level system would only be operative if the syndromes corresponding to the $2t_2$ block check bytes resulted in a non-zero condition after the codeword had been "corrected" by the first level system. Depending on the "error" environment, it will be seen by those persons skilled in the art that each level of the system could be implemented in a different manner permitting different cost-performance tradeoffs to be made reflecting error types and distributions in the block of data.

While the invention has been particularly shown and described with reference to a preferred embodiment thereof, it will be understood by those skilled in the art that various other changes in the form and details may be made therein without departing from the spirit and scope of the invention.

Having thus described my invention, what I claim as new and desire to secure by Letters Patent is:

1. A multibyte error correcting system operable to correct up to $t_1$ errors in each subblock of a block of data and $t_2$ errors in said block, where $t_2$ and $t_1$ are positive integers and $t_2 > t_1$, said block having:
   (a) at least one subblock, each of which has at least one codeword containing up to $2^b-1$ b-bit character positions, where b is any positive integer, each character position consisting of a unique combination of binary bits representing data and $2t_1$ check bytes; and
   (b) $2t_2$ b-bit block check bytes, said system comprising:
   first syndrome generating means for generating two $2t_1$ syndrome bytes each containing b bits by combining $2t_1$ stored check bytes associates with each stored codeword with newly developed $2t_1$ check bytes during the reading of each said stored codeword, said check bytes corresponding to the modulo 2 sum of bit positions of said codeword selected systematically in accordance with a predetermined parity check matrix;
   first syndrome processing circuitry operable to correct up to $t_1$ errors in each said codeword by processing said $2t_1$ syndrome bytes;
   second syndrome generating means for generating $2t_2$ block syndrome bytes each containing b bits by combining said $2t_2$ stored block check bytes with $2t_2$ block check bytes developed after all said codewords of said block have been read and corrected, each of said $t_2$ block check bytes corresponding to the modulo 2 sum of bit positions of corrected said codewords that are selected systematically in accordance with said parity check matrix;
   logic means for developing a new set of block syndrome bytes by modifying said original set of block syndrome bytes to reflect a miscorrection in one of said subblocks; and
   second syndrome processing circuitry for correcting up to $t_2$ errors in said one subblock by processing said modified set of $2t_2$ block syndrome bytes.

2. The system recited in claim 1 in which said parity check matrix reflects the roots $\alpha^a$, $\alpha^{a+1}$, $\alpha^{a-2}$, ... $\alpha^{a+2t-1}$ of a generator polynomial of a finite field of $2^b$ elements and $\alpha$ is any element of said finite field, and where a is any integer and t is $t_1$ or $t_2$.

3. The combination recited in claim 2 in which "b" and in which the powers a, a+1, a+2 ... of the said roots are adjacent integers.

4. The combination recited in claim 3 in which said powers employed for developing said $2t_1$ check bytes are a subset of said powers employed to develop said $2t_2$ check bytes.

5. The system recited in claim 1 in which said logic means includes a codeword buffer for storing each codeword as it is read and for storing error data developed by said first syndrome processing circuitry for said codeword as a result of processing said $2t_1$ syndrome bytes.

6. The combination recited in claim 1 in which said logic means operates to identify the subblock receiving the largest number of byte corrections.

7. The combination recited in claim 6 in which said second syndrome processing circuitry operates to correct up to $t_2$ errors in said identified subblock.

8. The combination recited in claim 7 in which said second syndrome processing circuitry corrects up to said $t_2$ errors in said one subblock as said block is being transferred from said buffer.

9. The combination recited in claim 7 in which said system will correct up to $(t_1-x)$ errors in each subblock by processing said $2t_1$ check bytes in said first processing circuitry and up to $(t_1+x)$ errors in one subblock by processing said $2t_2$ check bytes in said second syndrome processing circuitry where x is any non-negative integer and $0 \leq x \leq (t_2-t_1)$.

10. The combination recited in claim 1 in which there is one subblock in each block.

11. The combination recited in claim 1 in which there are a plurality of subblocks in each block.

12. A multibyte error correcting method operable to correct up to $t_1$ errors in each subblock of a block of data and $t_2$ errors in said block being read from storage, where $t_2$ and $t_1$ are positive integers and $t_2 > t_1$, said block having:

(a) at least one subblock, each of which has at least one codeword containing up to $2^b-1$ b-bit character positions, where b is any positive integer, each character position including $2t_1$ check byte positions; and (b) $2t_2$ b-bit block check bytes, said method comprising the following steps:

generating two $t_1$ syndrome bytes each containing b bits by combining said $2t_1$ check bytes associates in said storage with each said codeword with $2t_1$ check bytes newly developed during the reading of each said codeword from said storage, said check bytes corresponding to the modulo 2 sum of bit positions of said one codeword selected systematically in accordance with a predetermined parity check matrix;

processing said $2t_1$ syndromes to correct up to $t_1$ errors in each said codeword;

generating $2t_2$ block syndrome bytes each containing b bits by combining said $2t_2$ block check bytes after all said codewords of said block have been read and corrected, each said block check byte corresponding to the modulo 2 sum of bit positions of corrected said codewords that are selected systematically in accordance with said parity check matrix;

developing a new set of $2t_2$ block syndrome bytes by modifying the prior set of $2t_2$ block syndrome bytes to reflect a previous miscorrection in one of said subblocks in response to said prior set of $2t_2$ syndrome bytes having a non-zero condition; and processing said new set of modified block syndrome bytes for correcting up to $t_2$ errors in said one subblock that was previously miscorrected.

13. The method recited in claim 12 in which said parity check matrix reflects the roots $\alpha^a$, $\alpha^{a+1}$, $\alpha^{a+2}$, ... $\alpha^{a+2t-1}$ of a generator polynomial where $\alpha$ is any element of said finite field, and where a is any integer and t is $t_1$ or $t_2$.

14. The method recited in claim 12 in which said step of developing said new set of block syndrome bytes includes storing each codeword in a buffer as it is read and storing error data in said buffer developed by processing said $2t_1$ syndrome bytes.

15. The combination recited in claim 14 in which said step of processing for correcting up to $t_2$ errors in said one subblock occurs on-the-fly as said block is being transferred from an error correcting system to a utilization device.

16. The method recited in claim 14 in which said step of developing said new set of block syndrome bytes includes identifyng from a plurality of subblocks, each of which had up to $t_1$ errors corrected, the subblock in which the most bytes were corrected.

* * * * *

UNITED STATES PATENT AND TRADEMARK OFFICE
CERTIFICATE OF CORRECTION

PATENT NO. : 4,525,838
DATED : June 25, 1985
INVENTOR(S) : Arvind M. Patel

It is certified that error appears in the above-identified patent and that said Letters Patent is hereby corrected as shown below:

IN THE CLAIMS:

Column 12, line 36, delete "character position" and insert --codeword--.

Column 13, line 2, "$\alpha^{a-2}, \ldots$" should be --$\alpha^{a+2}, \ldots$--.

Column 13, line 6, "b" should be --"b" is 8--.

Column 13, line 49, delete "character position" and insert --codeword--.

Column 14, line 32, "$\alpha$is" should be --$\alpha$ is--.

Signed and Sealed this

Nineteenth Day of November 1985

[SEAL]

Attest:

DONALD J. QUIGG

Attesting Officer

Commissioner of Patents and Trademarks